United States Patent [19]

Humblet

[11] Patent Number: 4,562,423

[45] Date of Patent: Dec. 31, 1985

[54] DATA COMPRESSION

[75] Inventor: Pierre A. Humblet, Cambridge, Mass.

[73] Assignee: Codex Corporation, Mansfield, Mass.

[21] Appl. No.: 617,151

[22] Filed: Jun. 5, 1984

Related U.S. Application Data

[63] Continuation of Ser. No. 311,877, Oct. 15, 1981, abandoned.

[51] Int. Cl.⁴ ............................................. H03K 13/24
[52] U.S. Cl. ............................................. 340/347 DD
[58] Field of Search ............... 340/347 DD; 358/260, 358/261; 364/200, 900; 235/310

[56] References Cited

U.S. PATENT DOCUMENTS

| | | | |
|---|---|---|---|
| 3,048,784 | 8/1962 | Scherer | 328/14 |
| 3,156,768 | 11/1964 | Wagner | 178/68 |
| 3,183,442 | 5/1965 | Filipowsky | 340/347 DD |
| 3,377,981 | 10/1967 | Kagan et al. | 178/5 |
| 3,394,352 | 7/1968 | Wernikoff et al. | 340/172.5 |
| 3,560,639 | 2/1971 | Centanni | 178/6 |
| 3,686,631 | 8/1972 | Elliott | 340/146.3 |
| 3,694,813 | 9/1972 | Loh | 340/347 DD |
| 3,701,108 | 10/1972 | Loh | 340/347 DD |
| 3,717,851 | 2/1973 | Cocke et al. | 340/172.5 |
| 3,747,024 | 7/1973 | Choquet | 332/9 R |
| 3,777,066 | 12/1973 | Nicholas | 179/69.5 |
| 3,813,485 | 5/1974 | Arps | 178/6.8 |
| 3,935,386 | 1/1976 | Glasson | 375/67 |
| 3,962,647 | 6/1976 | Richman | 340/347 DD |
| 4,035,837 | 7/1977 | Starck et al. | 358/73 |
| 4,053,930 | 10/1977 | Ogawa | 358/133 |
| 4,100,369 | 7/1978 | Stenstrom | 375/67 |
| 4,103,287 | 7/1978 | Frank | 340/146.3 |
| 4,161,757 | 7/1979 | Spencer et al. | 358/261 |
| 4,168,513 | 9/1979 | Hains et al. | 358/261 |
| 4,410,955 | 10/1983 | Burke | 378/14 |

OTHER PUBLICATIONS

Gallager, "IEEE Transactions on Information Theory", vol. IT24, No. 6, Nov. 1978, pp. 668–674.
Faller, "Proc. 7th Asilomar Conf. on Circuits, Systems & Computers", 1973, pp. 593–597.
Lavelle Handout at ACM Computer Science Conf., Wash., DC, Feb. 1975.

Primary Examiner—Charles D. Miller

[57] ABSTRACT

A stream of source characters, which occur with varying relative frequencies, is encoded into a compressed stream of codewords, each having one, two or three subwords, by ranking the source characters by their current frequency of appearance, encoding the source characters having ranks no higher than a first number as one sub-word codewords, source characters having ranks higher than the first number but no higher than a second number as two sub-word codewords, and the remaining source characters as three sub-word codewords. The first number is changed and the second number is recalculated as required by the changing frequencies of the source characters to minimize the length of the stream of codewords.

8 Claims, 12 Drawing Figures

DATA COMPRESSION

This is a continuation of application Ser. No. 311,877, filed Oct. 15, 1981, now abandoned.

BACKGROUND OF INVENTION

This invention relates to encoding a stream of source characters into a shorter stream of codewords and decoding the codewords.

Different source characters may appear with different frequencies in a stream of source characters. Encoding more frequently appearing source characters as shorter codewords can reduce the length of the stream of codewords. The relative frequencies of appearance of different source characters can change over time.

SUMMARY OF THE INVENTION

In one aspect, the invention features apparatus for encoding a stream of source characters into a stream of codewords, each of the source characters being from a source alphabet, each of the source characters in the source alphabet having a possibly time-varying frequency of appearance in the stream of source characters, each of the codewords belonging to one of a plurality of groups of the codewords, the codewords in the groups comprising respectively different numbers of subwords, the apparatus comprising an encoder for encoding each of the source characters into one of the codewords, more frequently appearing source characters being encoded as codewords having fewer subwords, a monitor for counting the number of occurrences, in the stream of source characters, of each source character in a set of fewer than all of the source characters, and a group size selector responsive to the monitor for changing the numbers of codewords belonging respectively to the groups, whereby at least a portion of the stream of codewords is shortened.

In another aspect, the invention features apparatus for encoding a stream of source characters into a stream of codewords, each of the source characters being from a source alphabet, each of the source characters in the source alphabet having a possibly time-varying frequency of appearance in the stream of source characters, each of the codewords belonging either to a first, second, or third group of the codewords, the codewords in the groups comprising respectively one, two, or three equal length subwords, each of the subwords being from a subword alphabet, the apparatus comprising a frequency ranker for assigning to each of the source characters a rank corresponding to its current estimated relative frequency of appearance in the stream of source characters, an encoder for encoding according to a selectable code each of the source characters having a rank not higher than a selectable first number as a codeword having one subword, each of the source characters having a rank higher than the first number and not higher than a second number as a codeword having two subwords, and each of the source characters having a rank higher than the second number as a codeword having three subwords, the second number being fixed by the value of the first number, a monitor for counting the number of occurrences, in the stream of source characters, of each source character in a set of fewer than all of the source characters, and a selector responsive to the monitor for updating the first number to a new value when the new value will shorten at least a portion of the stream of codewords and for recalculating the second number from the first number.

In preferred embodiments, the set comprises those source characters for which the number of subwords in the associated codewords would be changed by changes in the first number and the second number; the set comprises the source characters having ranks equal to the first number, to one less than the first number, and to each number between the second number minus the number of subwords in the subword alphabet, and the second number plus one less than the number of subwords in the subword alphabet; the monitor comprises a counter for counting from a middle value up for each occurrence of the source characters having ranks equal to the first number and to one less than the first number, and down for each occurrence of the source characters having ranks equal to each number between the second number minus the number of subwords in the subword alphabet, and the second number plus one less than the number of subwords in the subword alphabet, and wherein the selector comprises an adder for increasing the first number by one when the counter reaches an upper value and for decreasing the first number by one when the counter reaches a lower value; the selectable code is caused to change when the first number is updated to a new value; a decoder is included for decoding the stream of codewords into the stream of source characters, the decoder comprising a decoder frequency ranker for determining for each of the source characters in the source alphabet the rank corresponding to its current estimated relative frequency of appearance, and wherein the decoder determines directly from the codewords in the stream of codewords which one of the selectable codes was used for encoding.

In another aspect, the invention features apparatus for encoding a stream of source characters into a stream of codewords, each of the source characters having a time-varying frequency of appearance in the stream of source characters, the apparatus comprising a rank store for storing the rank corresponding to the current estimated relative frequency of appearance of each source character in the stream of source characters, and a rank updater for exchanging the rank of each source character which appears in the stream of source characters with the rank of the next lower ranking one of the source characters, unless the source character which appears in the stream has the lowest possible rank.

In another aspect, the invention features apparatus for encoding a stream of source characters into a stream of codewords, each of the source characters being from a source alphabet, each of the source characters in the source alphabet having a time-varying frequency of appearance in the stream of source characters, the source characters being ranked in order of their current relative frequency of appearance, each of the codewords belonging either to a first, second, or third group of codewords, the codewords in the groups comprising respectively one, two, or three equal length subwords, each of the subwords being from a subword alphabet, the apparatus comprising an encoder for encoding each of the source characters having a rank not higher than a selectable first number as a codeword having one subword, each of the source characters having a rank higher than the first number and not higher than a second number as a codeword having two subwords, and each of the source characters having a rank higher than the second number as a codeword having three subwords, the second number being fixed by the value of the first number, a two-subword recoder for dividing by 16 any said codeword having two subwords and whose last subword is zero, and adding the result to 15 plus the product of 15 times the first number, to provide a revised codeword, and a three-subword recoder for dividing by 16 any codeword having three subwords and whose last subword is zero, and adding the result to 3573 plus said second number, and, if the resulting codeword is smaller than 3856, subtracting 16 from said resulting codeword, to provide a revised codeword.

The invention permits efficient, rapid, adaptive encoding of a source character stream into a compressed codeword stream; the code changes to accommodate changes in the relative frequency of appearance of the source characters; and the decoder can adjust to changing codes automatically based on the codewords received, without requiring special code-switching signals to be sent from the encoder to the decoder.

Other advantages and features will be be apparent from the following description of the preferred embodiment and from the claims.

DESCRIPTION OF THE PREFERRED EMBODIMENT

We turn now to the structure and operation of the preferred embodiment, first briefly describing the drawings thereof.

DRAWINGS

OVERALL STRUCTURE AND OPERATION

Figure 1:
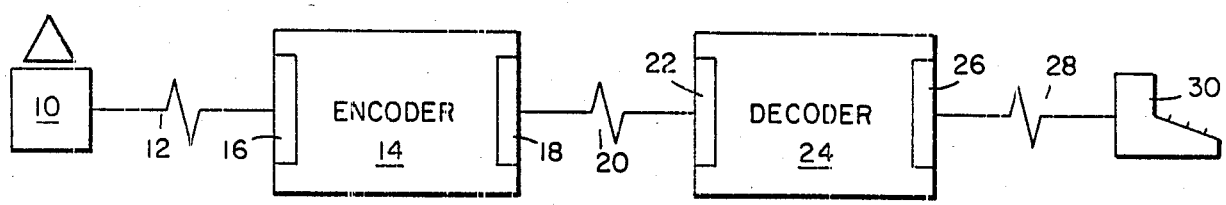
FIG. 1 is a block diagram of an encoding-decoding system.

In FIG. 1, terminal 10 generates a stream of source characters on line 12 in the form of voltages, currents, frequencies or other parameters representing binary digits. Encoder 14 receives the source characters at its port 16 and encodes them into a stream of binary codewords which are transmitted through port 18 onto link 20. The number of bits in the stream of codewords is generally smaller than the number of bits in the related stream of source characters. The form of the codewords permits independent decoding to obtain the original stream of source characters.

Link 20 may perform a variety of functions, including modulating and demodulating, switching, storing, and controlling transmission errors, but in any case link 20 eventually delivers the same sequence of codewords to port 22 of decoder 24 as were received from encoder 14. Decoder 24 decodes the codewords into a stream of source characters identical to the stream received at port 16 and delivers it through port 26 to line 28, which transmits it to terminal 30.

Another stream of data may be flowing in the opposite direction through the system at the same time, with respect to which decoder 24 acts as an encoder and encoder 14 acts as a decoder.

Each source character is one of 256 possible 8-bit bytes. Each codeword is made up of 1, 2 or 3 subwords (called nibbles) of 4 bits each.

In general, the first step in the encoding process is to rank the 256 source characters in order of decreasing frequency of appearance in the source stream. Two tables are kept by the encoder, one being a list of ranks (from 0 to 255) in source character order in which the ith entry is the rank of the ith source character; the second table being a list of source characters (from 0 to 255) in rank order in which the ith entry is the source character of rank i. When a source character of rank r appears in the source stream, the two tables are updated so that the rank of that source character becomes $r-1$ (if it is not already zero), and the source character that had rank $r-1$ is given rank r. Accordingly the two tables are constantly updated to reflect the relative frequencies of appearance of the source characters. The rank (before the tables are updated) of each source character appearing in the source stream determines the codeword into which it will be encoded.

For purposes of encoding, the 256 possible source characters are divided into three groups. Source characters of ranks from zero to a first number (N4E−1) are encoded as one-nibble codewords, those of ranks from N4E to a second number (N8E−1) are encoded as two-nibble codewords, and those of ranks from N8E to a third number (NL) are encoded as three-nibble codewords.

The determination of N4E, N8E and NL is governed by the so-called Kraft equality:

$$\frac{N4E}{NS} + \frac{(N8E - N4E)}{NS^2} + \frac{NL - N8E}{NS^3} = 1$$

where NS is the number of different available nibbles, and NL is a selected number (here 267) at least as great as the number of possible source characters. In the present case, each nibble has 4 bits, which would normally permit 16 different nibbles, but nibble 0000 is specified as an illegal nibble, so that NS=15, making the Kraft equality:

$$\frac{N4E}{15} + \frac{N8E - N4E}{15^2} + \frac{NL - N8E}{15^3} = 1$$

When N4E is incremented by one (i.e., one more source character is added to the group being coded as one-nibble codewords), the equality requires NL−N8E to be incremented by 15 and N8E−N4E to be decremented by 16, and, conversely, if N4E is decremented by one, NL−N8E must be decremented by 15 and N8E−N4E must be incremented by 16. Therefore, if the source character of rank N4E occurs more often than the source characters of ranks N8E−15 through N8E−1, then N4E should be incremented by one (i.e., an additional source character should be added to the group being encoded as one-nibble codewords); and N4E should be decremented by one if the source character of rank N4E−1 occurs less frequently than the source characters of ranks N8E to N8E+14, because doing so will shorten the encoded stream.

The selection of N4E and N8E is implemented by counting from a middle value (e.g., 64) up for each appearance of the source characters of ranks N4E−1 and N4E and down for each appearance of the source characters of ranks N8E−15 to N8E+14. When that count exceeds a first threshold (e.g., 128), N4E is incremented; when the count falls below a second threshhold (e.g., 0), N4E is decremented. Once N4E is determined, the value of N8E is recalculated in accordance with the Kraft equality.

Figure 2:
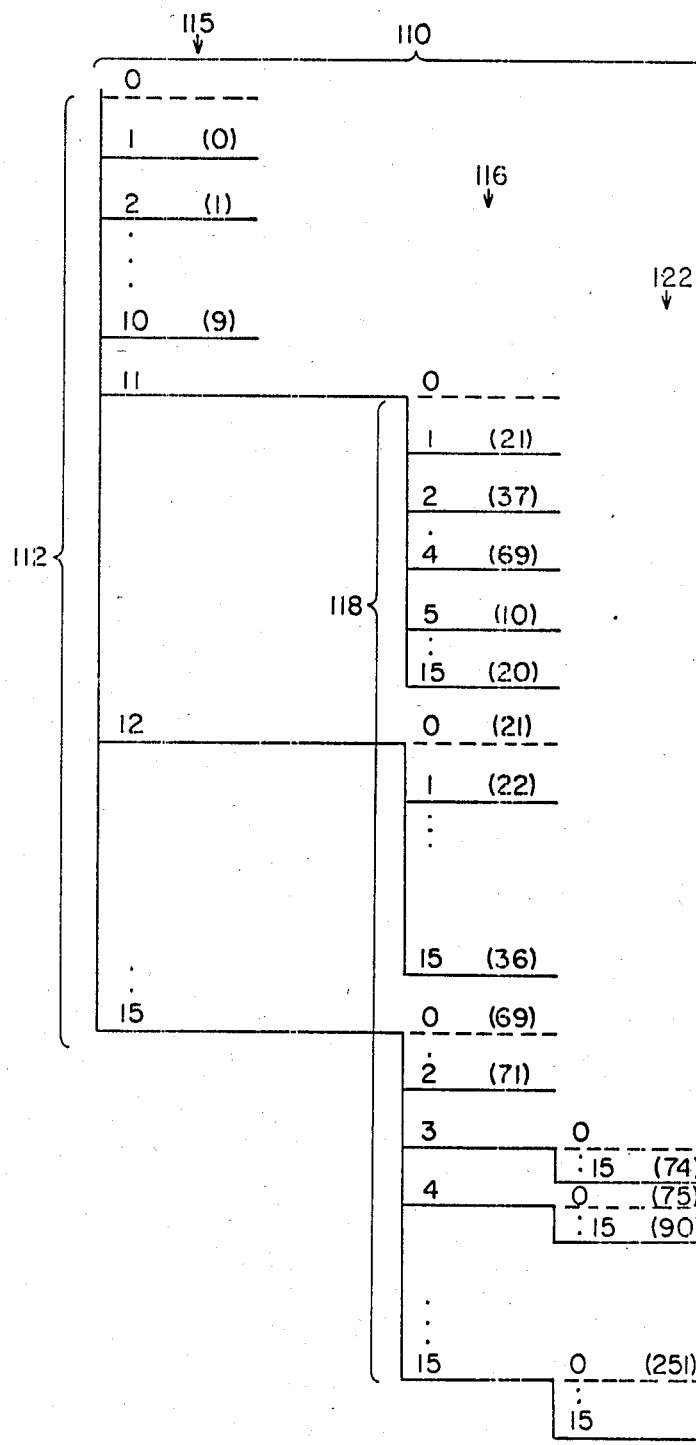
FIG. 2 is a table illustrating a typical coding sequence.

The next step is to assign each source character to a codeword. The process is illustrated in FIG. 2, which represents a tree having a number of levels (columns) 110 equal to the largest number of nibbles which make up a codeword, in this case three. The first level 115 contains branches 112 equal in number to the possible number of nibbles (in this case 16) and each branch 112 of first level 115 represents either a possible 4-bit codeword or a possible 4-bit prefix to an 8-bit or 12-bit codeword. Each branch 112 is labeled with one number, not enclosed in parentheses, indicating decimally the number of the nibble represented by that branch, and any branch 112 to which a source character may be assigned contains in parentheses the decimal rank of that source character. The second level 116 includes 16 sub-branches 118 for each branch 112 whose nibble is serving as a prefix. Each sub-branch 118 is similarly labeled with a nibble number, not in parentheses, and, in parentheses, the rank of the assigned source character. The third level 122 similarly includes 16 leaves 124 for each sub-branch 118 whose nibble was serving as a prefix. Each source character assigned to a leaf 124 at the third level would be encoded as a three-nibble word including the nibbles represented by the branch at the first level, the subbranch at the second level and the leaf at the third level.

Each branch, subbranch or leaf indicated as a dashed line represents the illegal nibble 0000 so that only 15 different nibbles are actually available at each level 110. The levels 110 of the tree of FIG. 2 are arranged to provide N4E available branches 112 at the first level for encoding N4E source characters as one-nibble codewords, N8E−N4E available sub-branches 116 at the second level for encoding N8E−N4E source characters as two-nibble codewords, and NL−N8E available leaves 124 at the third level for encoding the remaining source characters as three-nibble words.

ENCODER STRUCTURE

Figure 3:
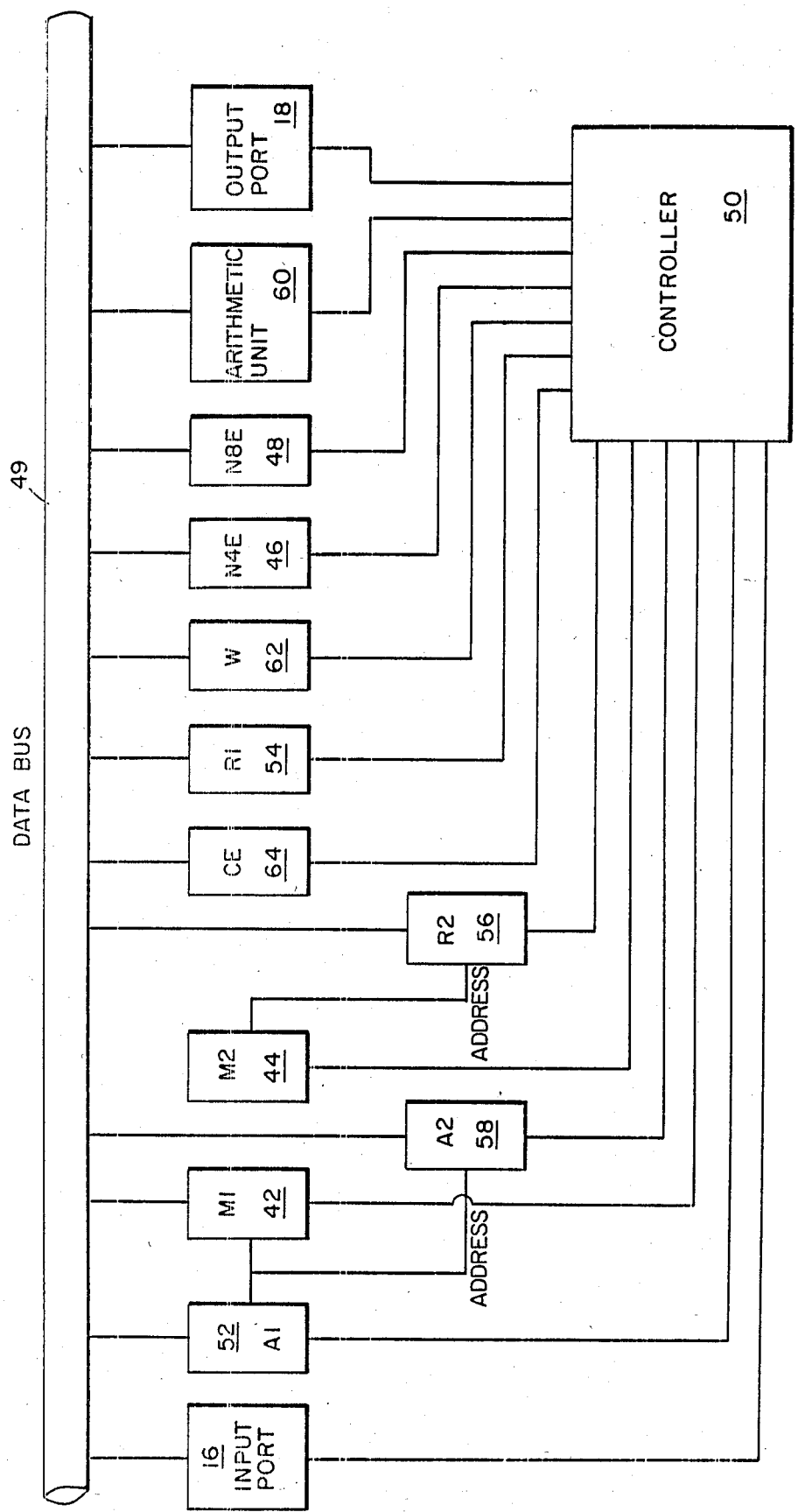
FIG. 3 is a block diagram of the encoder of FIG. 1.

As shown in FIG. 3, the encoder has input 16 on which it receives, possibly on an irregular schedule, the stream of 8-bit source characters.

Memory M1 42 contains 256 elements representing the 256 possible source characters. The elements of memory M1 42 are set to unique values between 0 and 255. The value r held in the ith element of memory M1 42 represents the ranking r of the ith source character in frequency of appearance in the stream of source characters. For example, if the 10th element of memory M1 42 contains the value 128, then the source character represented by the 10th element is estimated to be the 128th most frequently appearing character in the source stream.

Memory M2 44 contains 256 locations representing the 256 possible frequency rankings of the source characters. The value i held in the rth element of M2 represents the source character i which holds the rth rank in frequency of appearance. Accordingly, M1 is a table of rankings in source character order while M2 is a table of source characters in rank order. If the ith element of M1 is r, the rth element of M2 is i. It is most convenient initially to set the ith elements of both M1 and M2 to i.

Register N4E 46 contains the number N4E, and register N8E 48 the number N8E. N4E and N8E are initially set as non-negative integers such that the Kraft equality is satisfied, when NL is chosen as 267, as follows:

$$15\text{N4E} + \text{N8E} = 222$$

Register CE 64, which can initially be set to any value (e.g., 64), contains the count which forms the basis for changing N4E.

Arithmetic unit 60 performs required computations. The encoded stream of codewords is provided on output port 18. Register W 62 holds the nibbles of each codeword before transmission to port 18. Registers R1 54, R2 56, A1 52, and A2 58 are connected as shown. Each component of encoder 14 is attached to data bus 49 and is connected to and controlled by data processor controller 50 as illustrated in FIG. 3. The components of encoder 14 are implemented as a conventional microprocessor and memory.

ENCODER OPERATION

The results of each numerical operation described below are rounded down to the nearest integer.

Referring to FIGS. 3, 5A, 5B, 5C and 5D, when a source character byte is received on port 16, controller 50 moves it to register A1 52. The source character is register A1 52 then serves as an address pointer for table M1 42, which provides the rank r of the source character to register R1 54. If register R1 54 does not then hold a 0 (i.e., the source character is not of the lowest rank, i.e., highest frequency of appearance), the rank value (r) is transferred from R1 54 to register R2 56 which is then decremented by 1 to (r−1). Register R2 56 then serves as an address pointer for table M2 44 and the source character having rank (r−1) is placed in register A2 58, which serves as an address pointer to register M1 44. The number in register A1 52 (i.e., the source character) is loaded into location (r−1) of table M2 44. Register R2 56 is then incremented by 1 to r and the number in register A2 58 is stored in location r of M2 44. Location A1 of table M1 42 is decremented, and location A2 of table M1 42 is incremented.

If the ith element of table M1 42 is thought to contain the rank of source character i, and the rth element of table M2 44 is thought to contain the source character of rank r, the previous operation has the effect of placing the rank of the incoming source character into register R1 54, exchanging the rank of that source character with the rank of the next lower ranking source character, and updating tables M1 42 and M2 44 accordingly.

The contents of R1 54 (the rank r of the incoming source character) is compared with the contents of N4E 46 and N8E 48 and the value of CE is changed as follows. If r equals N4E or N4E−1, CE is incremented. If r is less than N8E+15 and greater than or equal to N8E−15, CE is decremented.

Based on the results of the following comparisons between the contents of register R1 54, N4E 46 and N8E 48, the following actions are taken:

If R1 is less than N4E (indicating that the incoming source character is within the group to be coded as one-nibble words), R1 54 is incremented by 1 and transferred to register W 62, (i.e., that source character is coded as a codeword equal in number to one more than its rank—this is illustrated in FIG. 2 in which N4E=10 and the source character of rank 0 is coded as nibble 1, while the source character of rank 1 is coded as nibble 2).

If R1 is at least as large as N4E but less than N8E (i.e., the incoming source character is to be coded as a two-nibble word), then $$(N4E)15 + 17 + \frac{(N8E - N4E - 1)}{15}$$

is added to register R1 54 and transferred to W 62 (to become the potential two-nibble codeword). If the 4 least significant bits of the result are 0 (i.e., represent the illegal nibble (0000), the value (W/16)+15 (N4E)+15 is computed and the answer is transferred to register W 62 (to become the final two-nibble codeword).

If R1 is at least as large as N8E (i.e., the codeword will be three nibbles long) 3829 is added to register R1 54 and the result placed in register W 62. If the 4 least significant bits of the result are not 0 (i.e., the third nibble is not illegal), the contents of register W 62 is divided by 16 and the result added to 3573+N8E. If that result is less than 3856, 16 is subtracted from it. The result is sent to register W 62.

By the previous encoding operation, one, two or three non-zero nibbles are loaded into register W 62 as the codeword depending on the rank of the incoming source word. The zero nibble is not permanently written into register W 62 in a less significant position than the position of a non-zero nibble. The codeword is then transmitted from output port 18 beginning with the most significant non-zero nibble.

Finally, if CE has reached the UPPER or LOWER threshhold value, CE must be reset to MIDDLE and N4E and N8E must be changed to adjust the number of source characters being encoded as one-nibble, two-nibble and three-nibble codewords in order to minimize the length of the encoded stream. This is accomplished as follows.

If CE=UPPER and N8E is greater than 15, then CE is reset to MIDDLE, N4E is incremented by 1 and N8E is decremented by 15.

If CE=LOWER and N4E is not zero, CE is reset to MIDDLE, N4E is decremented by 1 and N8E is incremented by 15.

UPPER is the upper threshhold previously described and LOWER is the lower threshhold previously described. UPPER is greater than MIDDLE which is greater than LOWER, and these values control the rapidity with which the coding is changed as the relative frequencies of appearance of the characters in the source stream change. Values of UPPER=128, MIDDLE=64 and LOWER=0 are used for 8-bit source characters.

When CE grows large, N4E is increased causing more source characters to be encoded as single nibbles, and conversely, when CE grows small. The effect is to minimize the length of the stream of codewords as the relative frequency of appearance of the source characters shifts.

At this point, encoder 14 waits for the next source character to appear and the process is repeated.

After each source character is processed, encoder 14 contains tables (M1 and M2) reflecting the frequency ranks of all possible source characters, numbers (N4E and N8E) which determine the groups of source characters which will be encoded as one, two and three-nibble codewords, a number CE which measures the relative desirability of changing N4E and N8E, and a program for uniquely encoding the next received source character in accordance with its rank and the values of N4E and N8E.

DECODER STRUCTURE

Figure 4:
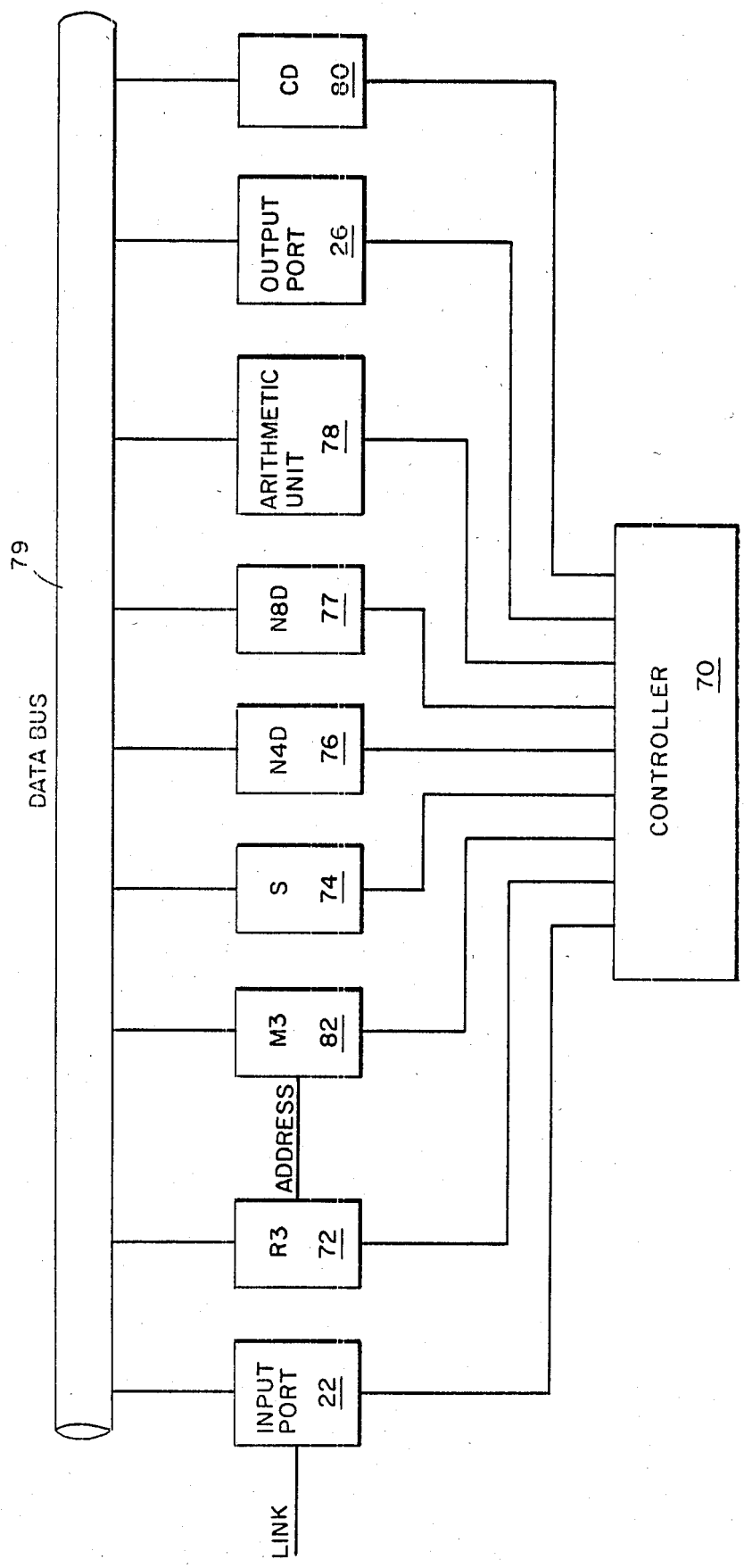
FIG. 4 is a block diagram of the decoder of FIG. 1.
Figure 5A:
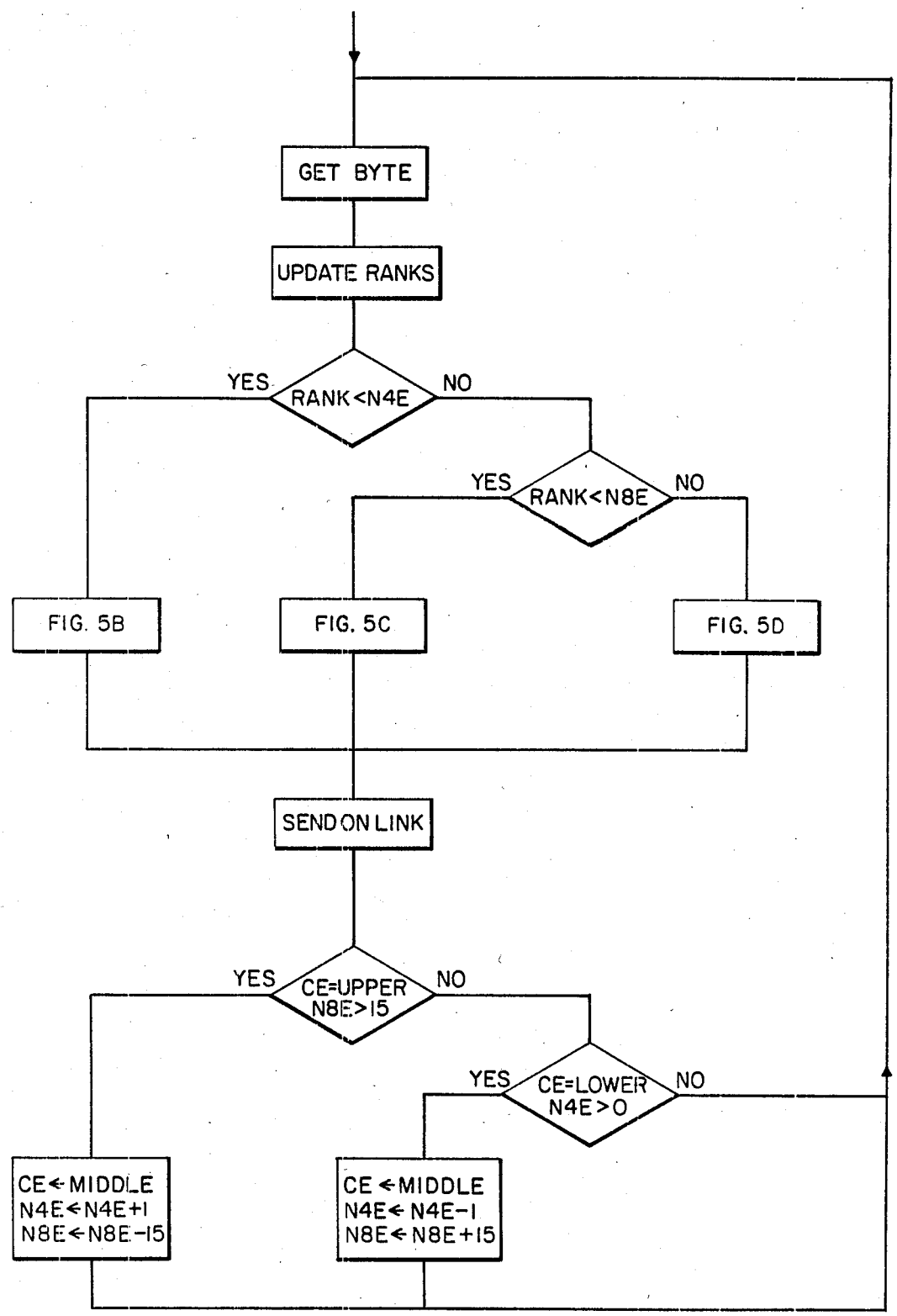
FIGS. 5A through 5D are flow charts of the encoding process.
Figure 5B:
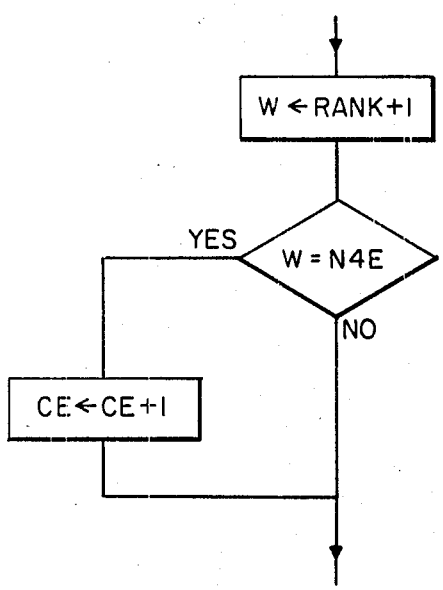
Figure 5C:
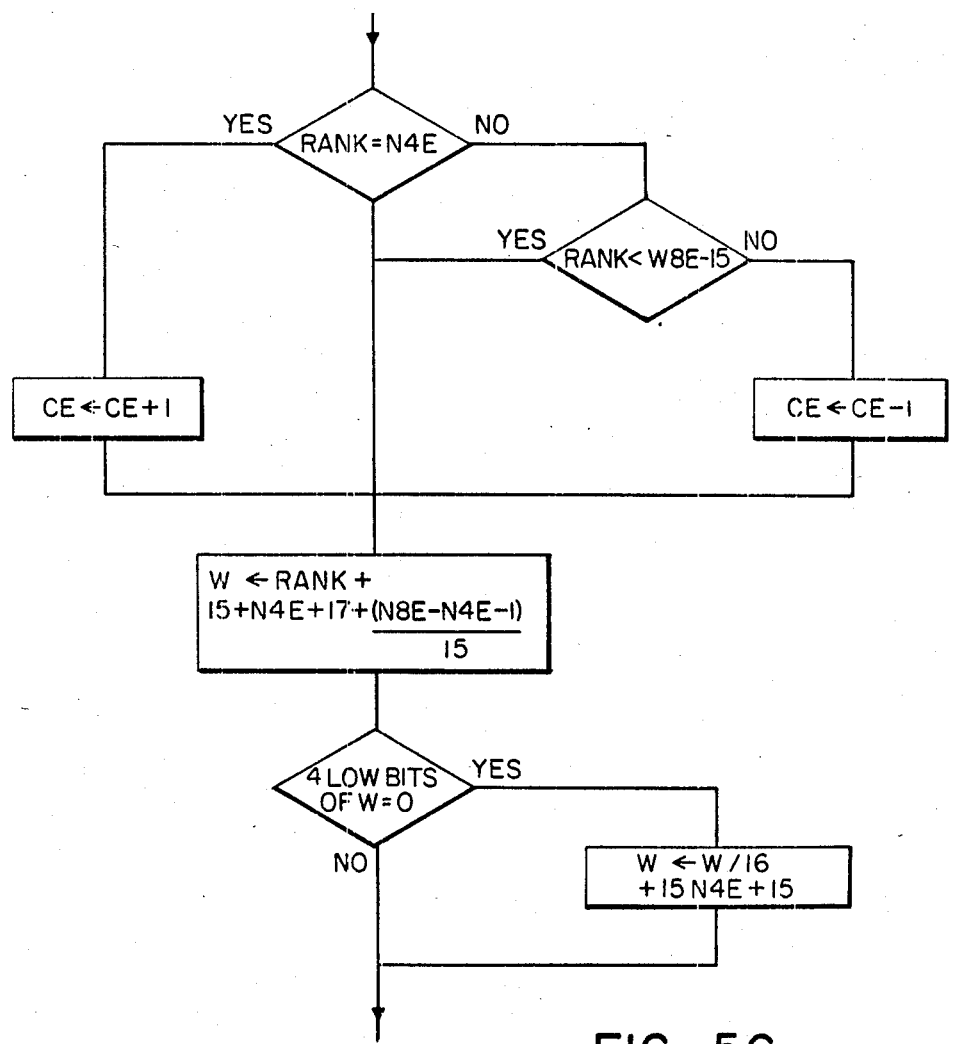
Figure 6A:
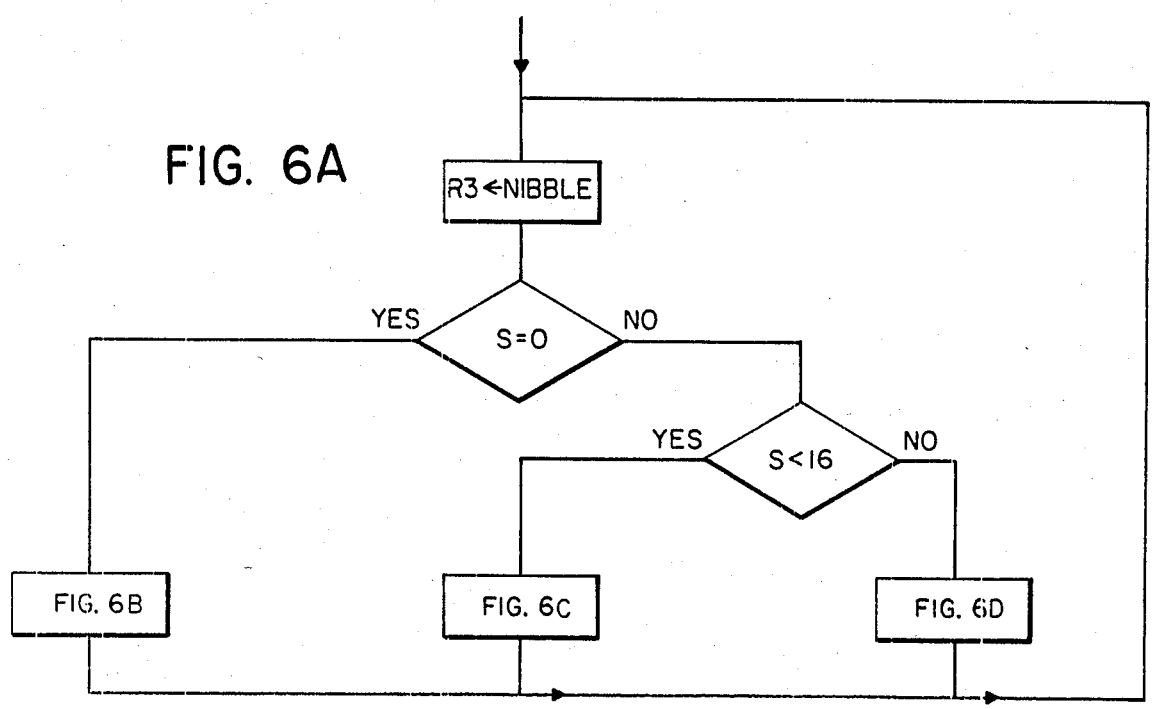
FIGS. 6A through 6D are flow charts of the decoding process.
Figure 5D:
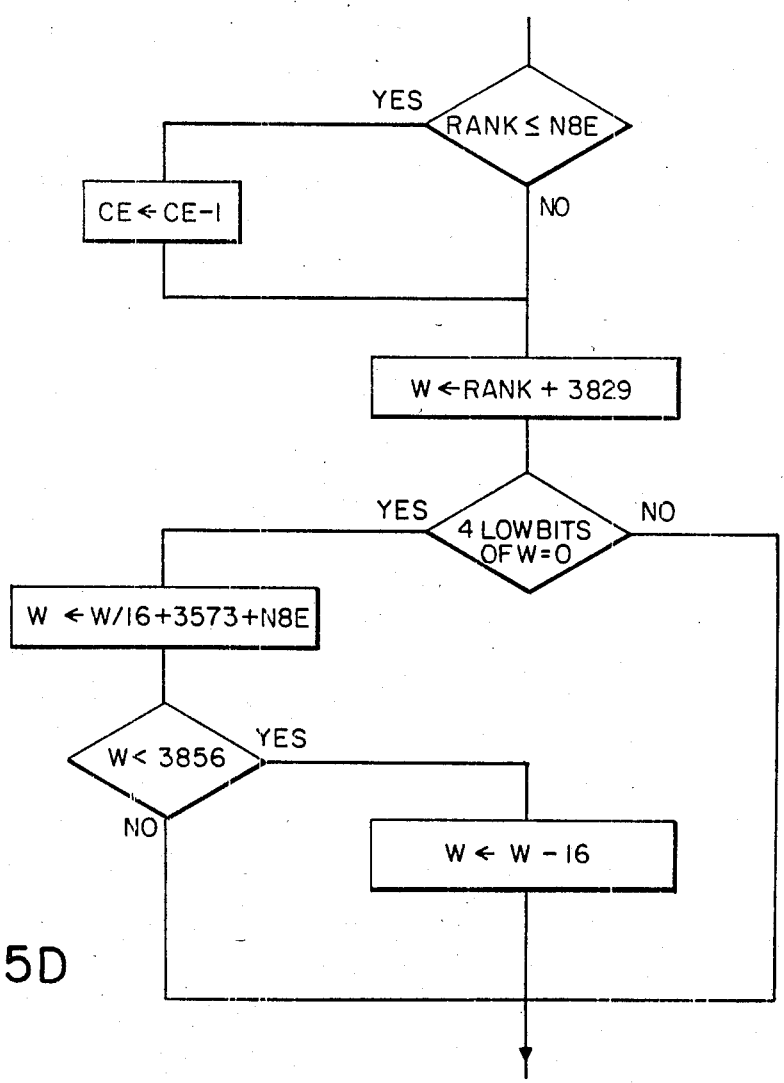
Figure 6B:
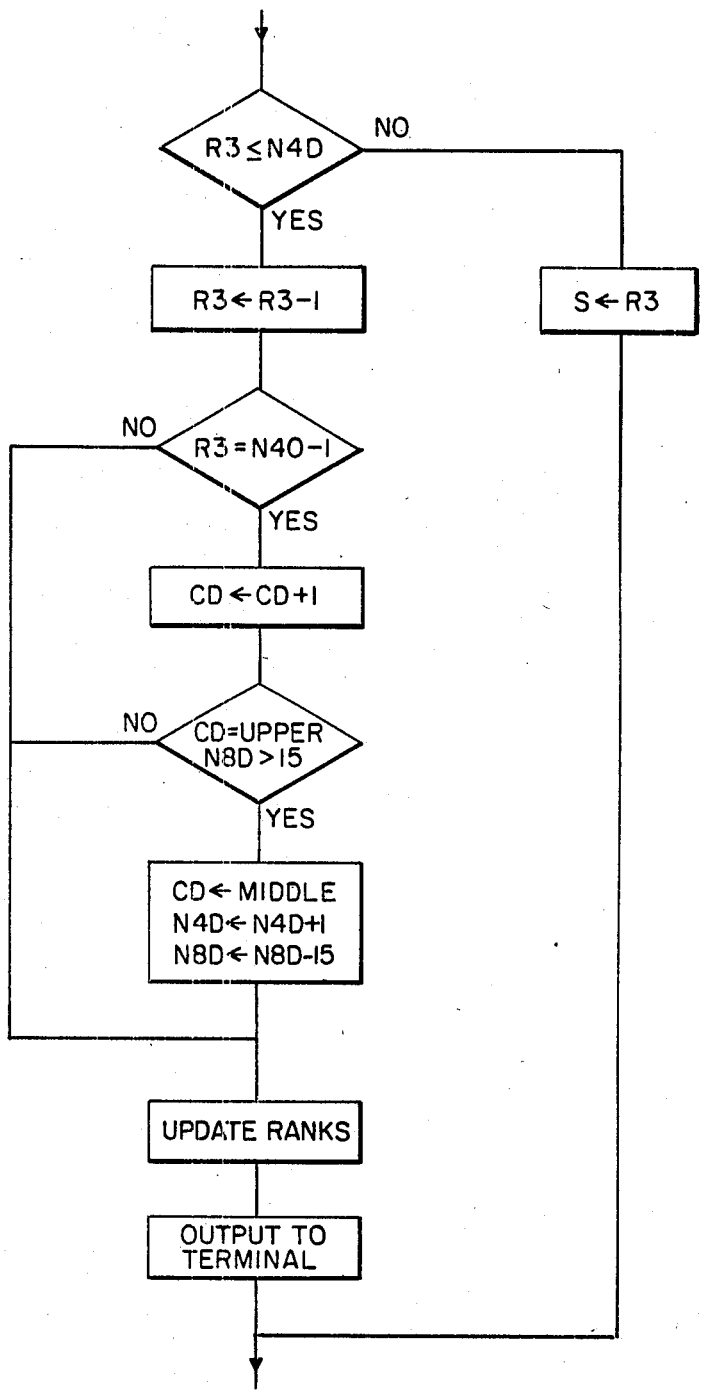
Figure 6C:
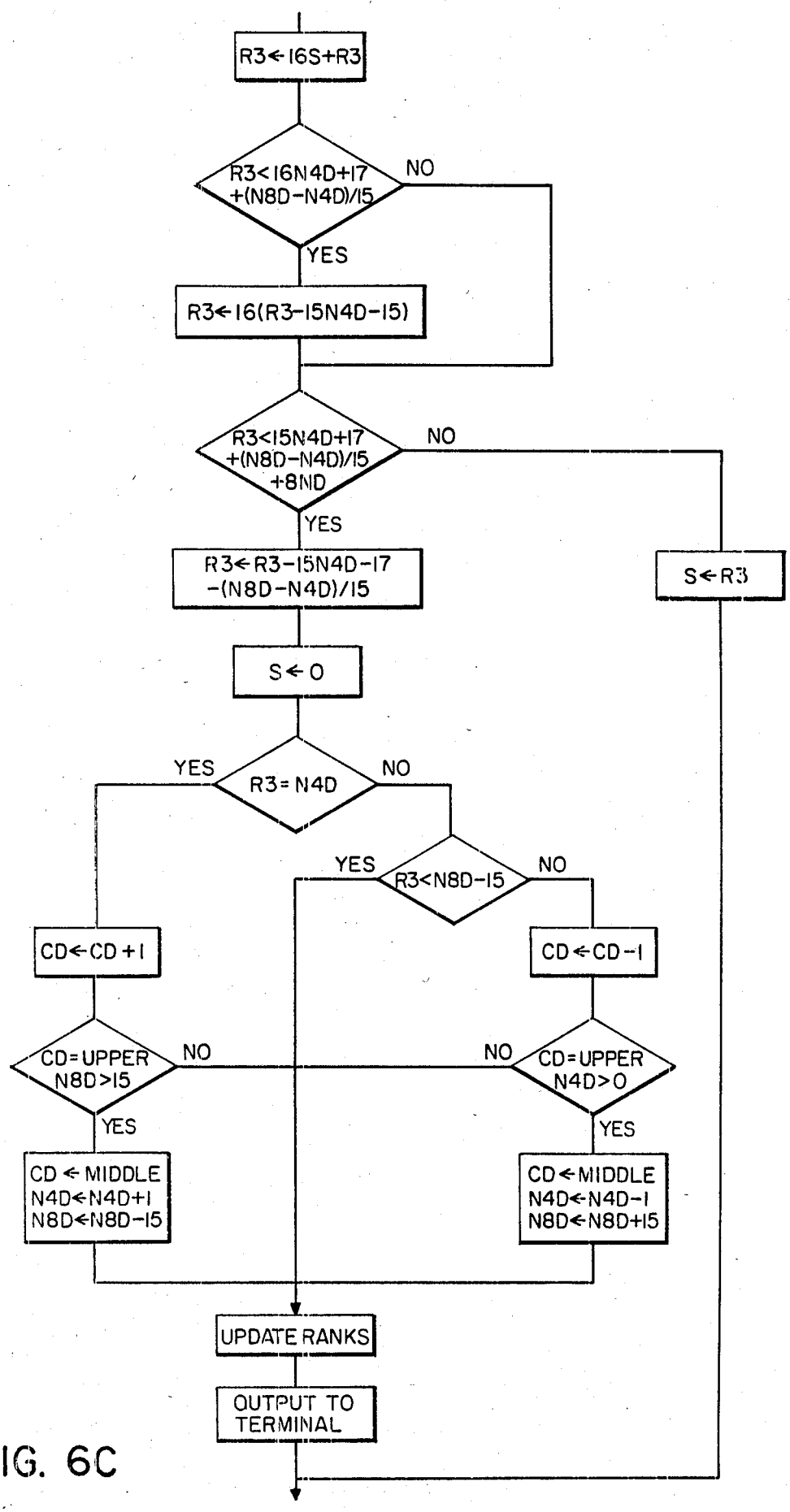
Figure 6D:
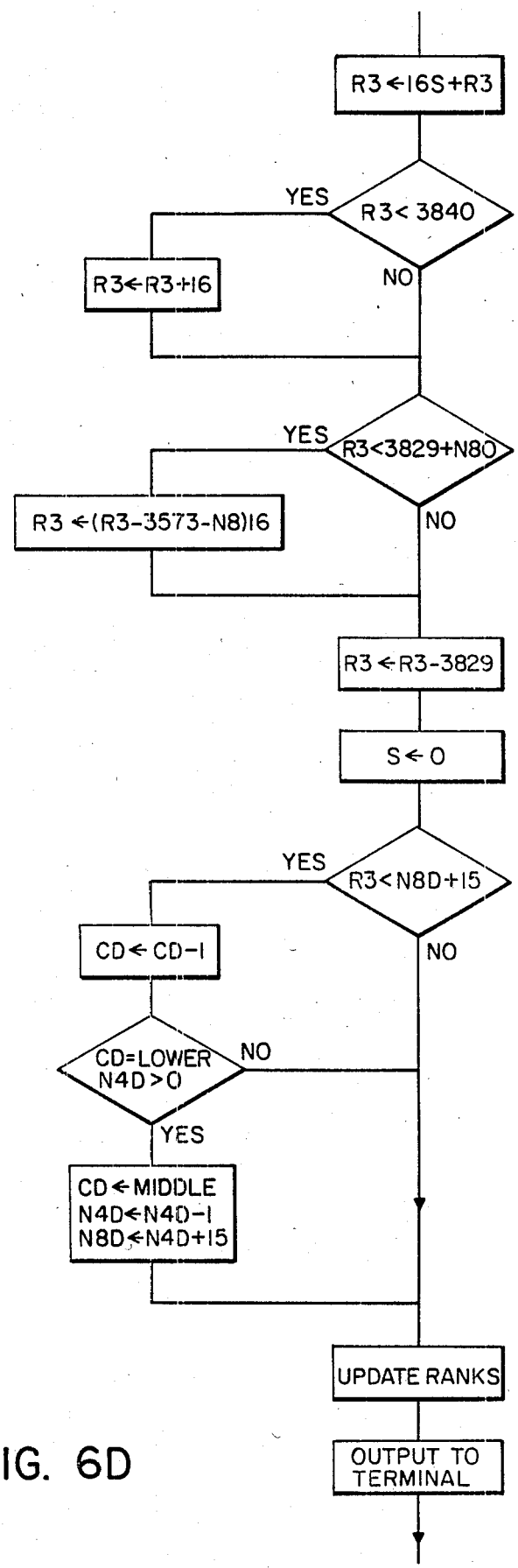

As shown in FIG. 4, decoder 24 has input port 22, on which it receives a stream of codewords, each comprising one, two or three 4-bit nibbles, output port 26 to which it delivers the stream of decoded source characters, and arithmetic unit 78 for performing computations. Table M3 82 corresponds to table M2 of the encoder, registers N4D 76 and N8D 66 correspond to registers N4E and N8E of the encoder, register CD 80 corresponds to register CE of the encoder and register S 74 holds a value which indicates whether the first, second or third nibble of a codeword is being processed. The components of decoder 24 are attached to data bus 79, and are controlled by data processor controller 70. The components of decoder 24 are implemented as a conventional microprocessor and memory.

DECODER OPERATION

Prior to operation, table M3 is initialized to be the same as table M2 of the encoder, and register N4D, N8D and CD are set to the same values as the corresponding registers of the encoder. Register S is initially set to zero in preparation for processing the first nibble of the first incoming codeword.

Referring to FIGS. 4, 6A, 6B, 6C, and 6D, when a nibble is received on port 22, controller 70 tranfers it to register R3 72 and takes the following actions, depending on the value stored in register S 74. The value in register S indicates whether a first nibble, second nibble or third nibble of a codeword is being processed.

If S is zero, indicating the first nibble in a codeword, then register R3 is compared with the value in register N4D 76. If R3 is less than or equal to N4D (i.e., the codeword is only one nibble long) then R3 is decremented to obtain the rank of the source character; otherwise R3 is transferred to register S.

If S is greater than 0 and less than 16, indicating the second nibble in a codeword, the content of register S 74 is multiplied by 16 and the result is added to R3. If R3 is then less than $$16 \, N4D + 17 + \frac{(N8D - N4D)}{15},$$

then 15 N4D+15 is subtracted from R3, the result is multiplied by 16 and returned to R3. If R3 is then less than $$\left[ 15 \, N4D + 17 + \frac{(N8D - N4D)}{15} + N8D \right]$$

then $$\left[ 15 \, N4D + 17 + \frac{(N8D - N4D)}{15} \right]$$

is subtracted from R3 and S is cleared, otherwise R3 is sent to S.

If S is greater than or equal to 16, indicating the third nibble of a codeword, then the content of register S 74 is multiplied by 16 and the result is added to R3. If R3 is then less than 3840, then 16 is added to it and, if the resulting R3 is less than 3829+N8D, then 3573+N8D is subtracted from R3, the result is multiplied by 16 and that result is stored in R3. Then 3829 is subtracted from R3 and S is cleared.

When these operations are completed, if the value of S is 0, indicating that a new codeword is about to be received, the value in CD must be updated to conform to the value of CE so that the encoder and decoder will be operating with the same codes. This is accomplished by controller 73 performing the following functions:

The contents of R3 (which contains the rank of the source character corresponding to the codeword just decoded) are compared with the contents of N4D and N4E. If R3=N4D−1 or R3=N4D, then register CD 80 is incremented. If R3 is greater than or equal to N8D−15 and less than N8D+15 then register CD 80 is decremented.

Controller 70 then places in output port 26, the contents of location R3 of table M3 82 (which is the source character of rank R3) and, if R3 is greater than zero (that is the source character is not of the lowest rank), the contents of locations R3 and R3−1 in table M3 are interchanged, which effectively exchanges the ranks of the source character just processed and the source character of the next lower rank, thereby causing table M3 to correspond to table M2 44 of encoder 14.

Next, controller 70 checks the value of CD against the same threshholds, UPPER and LOWER, used by encoder 14 and performs the following:

If CD=UPPER and N8D greater than B 15, then CD is set to MIDDLE, N4D is incremented by 1 and N8D is decremented by 15.

If CD=LOWER and N4D is greater than 0, then CD is set to MIDDLE, N4D is decremented by 1 and N8D is incremented by 15.

These steps have the effect of internally updating the values of CD, N4D and N8D to correspond exactly to CE, N4E and N8E, respectively, in encoder 14.

Finally, the decoded source character on output port 26 is provided to line 28. Controller 70 waits until the next code word appears on input port 22 and then repeats the process.

Decoder 24 therefore decodes each received codeword into the corresponding source character using the reverse process of the encoder based on decoding parameters N4D and N8D and a list M3 of source characters in rank order. N4D and N8D are changed when a value CD exceeds preprogrammed thresholds, UPPER and LOWER which are the same as those programmed into encoder 14. CD is updated to be the same as value CE. M3 is updated to show the current rankings of the source characters by the same process used in encoder 14. No information other than the source character stream needs to be transmitted from encoder 14 to decoder 24 to coordinate their respective activities, since the required coding information is implicitly contained in the codewords themselves.

Other embodiments are within the following claims.

I claim:

1. Apparatus for encoding a stream of source characters into a stream of codewords, each of said source characters being from a source alphabet, each of said source characters in said source alphabet having a possibly time-varying frequency of appearance in said stream of source characters, each said codeword being associated at a given time with a rank in a rank ordering, the rank ordering being indicative of the current estimated relative frequencies of appearance of the codewords associated with said ranks, each of said codewords belonging to one of a plurality of groups of said codewords, said codewords in said groups comprising respectively different numbers of subwords, said apparatus comprising:
   an encoder for encoding each of said source characters into one of said codewords, more frequently appearing source characters being encoded as codewords having fewer subwords,
   a monitor for monitoring the occurrences, in said stream of source characters, of said source characters associated with a set of fewer than all of said ranks in said rank ordering, and
   a group size selector responsive to said monitor for changing the numbers of codewords belonging respectively to said groups, whereby at least a portion of said stream of codewords is shortened.

2. Apparatus for encoding a stream of source characters into a stream of codewords, each of said source characters being from a source alphabet, each of said source characters in said source alphabet having a possibly time-varying frequency of appearance in said stream of source characters, each of said codewords belonging either to a first, second, or third group of said codewords, said codewords in said groups comprising respectively one, two, or three equal length subwords, each of said subwords being from a subword alphabet, said apparatus comprising:
   a frequency ranker for assigning to each of said source characters a rank corresponding to its current estimated relative frequency of appearance in said stream of source characters, higher ranks corresponding to lower frequencies of appearance,
   an encoder for encoding according to a selectable code each of said source characters having a rank not higher than a selectable first number as a codeword having one subword, each of said source characters having a rank higher than said first number and not higher than a second number as a codeword having two subwords, and each of said source characters having a rank higher than said second number as a codeword having three subwords, said second number being fixed by the value of said first number,
   a monitor for monitoring the occurrences, in said stream of source characters, of said source characters associated with a set of fewer than all of said ranks, and
   a selector responsive to said monitor for updating said first number to a new value when said new value will shorten at least a portion of said stream of codewords and for recalculating said second number from said first number.

3. The apparatus of claim 2 wherein said set comprises those source characters for which the number of subwords in the associated codewords would be changed by changes in said first number and said second number.

4. The apparatus of claim 3 wherein said set comprises the source characters having ranks equal to said first number, to one less than said first number, and to each number between said second number minus the number of said subwords in said subword alphabet, and said second number plus one less than the number of subwords in said subword alphabet.

5. The apparatus of claim 2 wherein said monitor comprises a counter for counting from a middle value up for each occurrence of said source characters having ranks equal to said first number and to one less than said first number, and down for each occurrence of said source characters having ranks equal to each number between said second number minus the number of subwords in said subword alphabet, and said second number plus one less than the number of subwords in said subword alphabet, and wherein said selector comprises an adder for increasing said first number by one when said counter reaches an upper value and for decreasing said first number by one when said counter reaches a lower value.

6. The apparatus of claim 2 wherein said selectable code is caused to change when said first number is updated to a new value.

7. The apparatus of claim 2 further comprising a decoder for decoding said stream of codewords into said stream of source characters, said decoder comprising
a decoder frequency ranker for determining for each of said source characters in said source alphabet said rank corresponding to its said current estimated relative frequency of appearance, and
wherein said decoder determines directly from said codewords in said stream of codewords which one of said selectable codes was used for said encoding.

8. Apparatus for encoding a stream of source characters into a stream of codewords, each of said source characters being from a source alphabet, each of said source characters in said source alphabet having a time-varying frequency of appearance in said stream of source characters, said source characters being ranked in order of their current relative frequency of appearance, each of said codewords belonging either to a first, second, or third group of said codewords, said codewords in said groups comprising respectively one, two, or three equal length subwords, each of said subwords being from a subword alphabet, said apparatus comprising:
an encoder for encoding each of said source characters having a rank not higher than a selectable first number as a codeword having one subword, each of said source characters having a rank higher than said first number and not higher than a second number as a codeword having two subwords, and each of said source characters having a rank higher than said second number as a codeword having three subwords, said second number being fixed by the value of said first number,
a two-subword recoder for dividing by 16 any said codeword having two subwords and whose last subword is zero, and adding the result to 15 plus the product of 15 times said first number, to provide a revised codeword, and
a three-subword recoder for dividing by 16 any said codeword having three subwords and whose last subword is zero, and adding the result to 3573 plus said second number, and, if the resulting codeword is smaller than 3856, subtracting 16 from said resulting codeword, to provide a revised codeword.

* * * * *